United States Patent
Hoffmann

(10) Patent No.: US 8,747,121 B1
(45) Date of Patent: Jun. 10, 2014

(54) TELEVISION TUNER MODULE HAVING A SHIELDED HOUSING MOUNTED ON AN OUTER CIRCUIT BOARD AND HAVING AN INNER CIRCUIT BOARD WITH A TUNER CHIP

(71) Applicant: Cresta Technology Corporation, Santa Clara, CA (US)

(72) Inventor: Rainer Hoffmann, San Jose, CA (US)

(73) Assignee: Cresta Technology Corporation, Santa Clara, CA (US)

( * ) Notice: Subject to any disclaimer, the term of this patent is extended or adjusted under 35 U.S.C. 154(b) by 37 days.

(21) Appl. No.: 13/749,615

(22) Filed: Jan. 24, 2013

(51) Int. Cl.
*H01R 12/00* (2006.01)

(52) U.S. Cl.
USPC .......................................................... 439/63

(58) Field of Classification Search
USPC ...................................................... 439/63–75
See application file for complete search history.

(56) References Cited

U.S. PATENT DOCUMENTS

| | | | |
|---|---|---|---|
| 4,736,266 A * | 4/1988 | Tanibe ........................ | 361/816 |
| 5,053,910 A | 10/1991 | Goldstein | |
| 5,791,911 A * | 8/1998 | Fasano et al. .................. | 439/63 |
| 6,011,700 A | 1/2000 | Matsuzaki | |
| 6,086,383 A * | 7/2000 | Fasano et al. .................. | 439/63 |
| 6,302,701 B1 * | 10/2001 | Miller et al. .................... | 439/63 |
| 6,373,711 B2 | 4/2002 | Yamauchi et al. | |
| 6,404,309 B1 | 6/2002 | Hall et al. | |
| 7,109,831 B2 | 9/2006 | McMiller et al. | |
| 7,113,061 B2 | 9/2006 | Ootori et al. | |
| 7,466,564 B2 | 12/2008 | Harada et al. | |
| 7,616,081 B2 | 11/2009 | Inaba et al. | |
| 7,634,225 B2 | 12/2009 | Kawakami et al. | |
| 7,692,520 B2 * | 4/2010 | Kim et al. ........................ | 334/85 |
| 7,711,343 B2 | 5/2010 | Soh et al. | |
| 2006/0268184 A1 | 11/2006 | Kim et al. | |
| 2007/0291182 A1 * | 12/2007 | Kim et al. ..................... | 348/731 |
| 2009/0220013 A1 * | 9/2009 | Butts et al. .................... | 375/257 |
| 2010/0214494 A1 | 8/2010 | Yokouchi et al. | |
| 2010/0270068 A1 | 10/2010 | Pang et al. | |
| 2012/0019731 A1 | 1/2012 | Imai et al. | |
| 2012/0200782 A1 * | 8/2012 | Imai et al. ..................... | 348/731 |

OTHER PUBLICATIONS

Abilis, "Product—ATON DTV receiver," p. 1-3, Abilis Systems, Geneva, Switzerland, archive.org indicates document was online on May 21, 2012.
Mathys, Y., "AT810: A New Benchmark for Silicon Tuners," p. 1-4, Abilis Systems, Geneva, Switzerland, Oct. 4, 2010.

* cited by examiner

*Primary Examiner* — Chandrika Prasad
(74) *Attorney, Agent, or Firm* — Law Office of Andrei D Popovici, PC

(57) ABSTRACT

Described systems and methods allow the manufacture of compact television (TV) tuner modules comparable in size to standard RF connectors. In some embodiments, a compact TV tuner module (tuner can) includes a metallic housing mounted on an external printed circuit board (PCB), a radio-frequency (RF) connector, an internal PCB within the housing, and a bare-silicon TV tuner chip centrally mounted on a side of the internal PCB facing away from the RF connector, directly opposite a central contact made directly a central pin of the RF connector and a central area of the internal PCB. A major dimension of a shielded internal volume enclosed by the housing is less than 150% of an outer shell of the RF connector, and may be about equal to or slightly larger than the diameter of the RF connector.

20 Claims, 3 Drawing Sheets

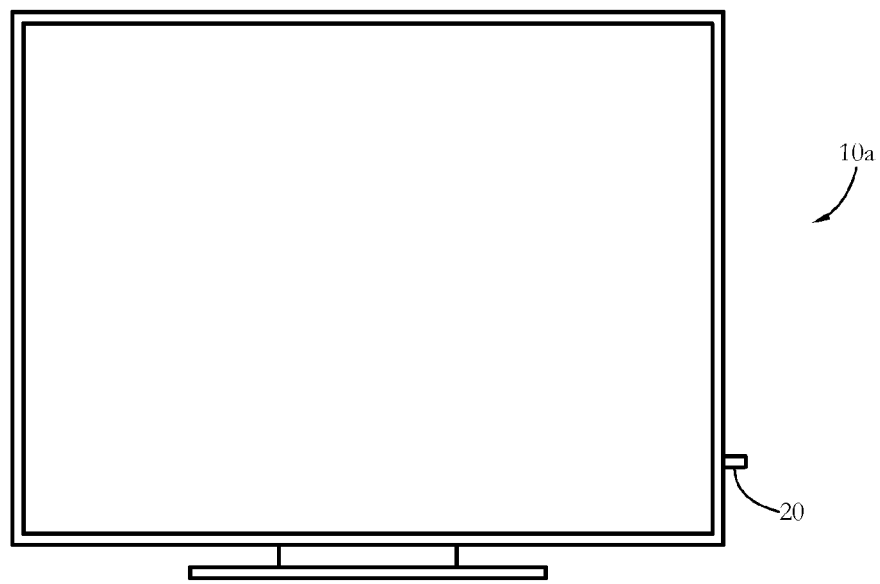
FIG. 1-A
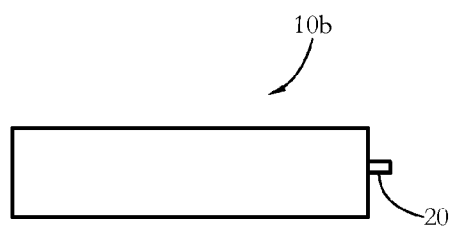
FIG. 1-B
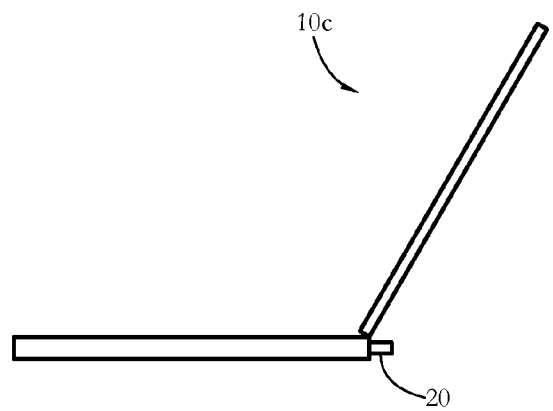
FIG. 1-C

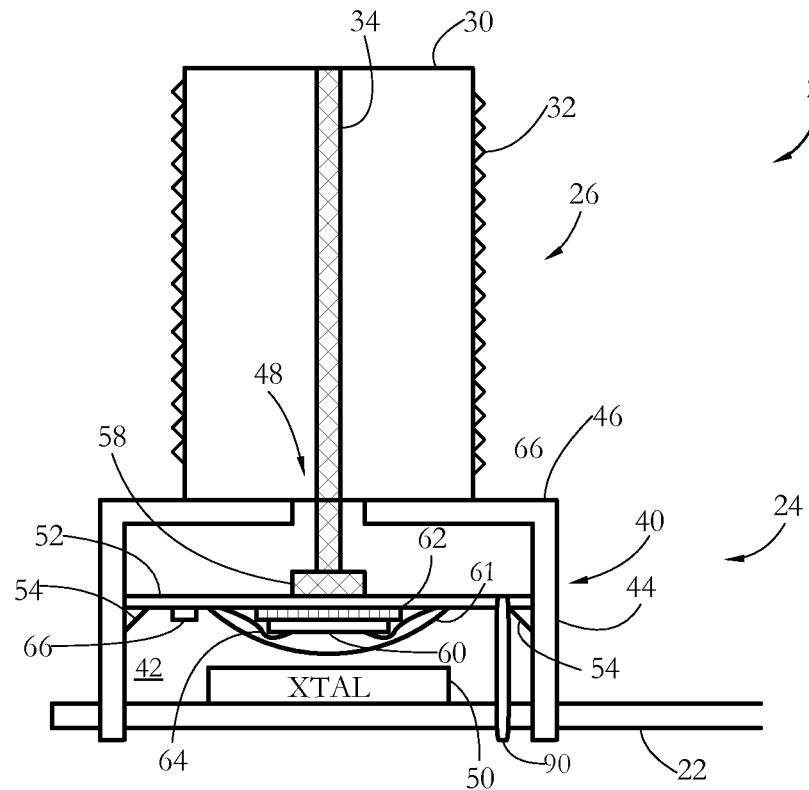
FIG. 2-A
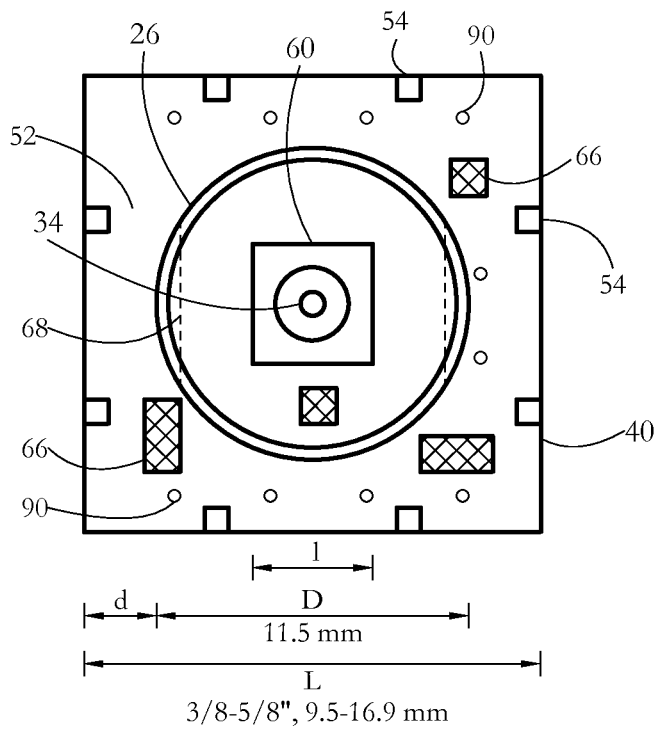
FIG. 2-B

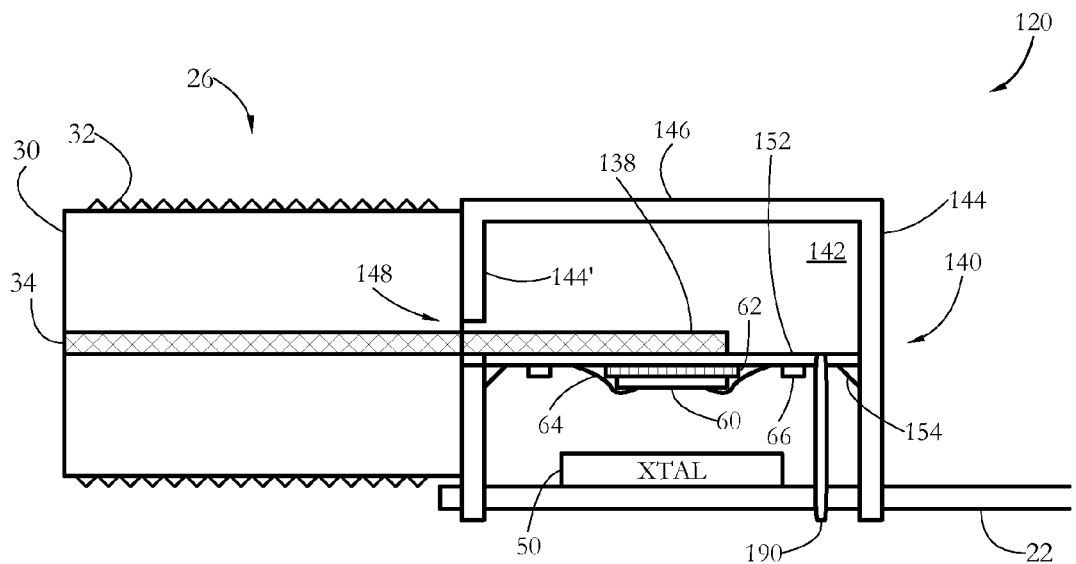
FIG. 3-A
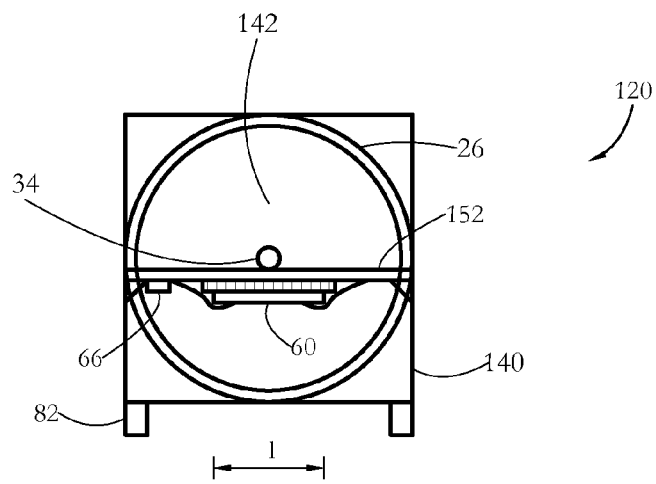
FIG. 3-B

TELEVISION TUNER MODULE HAVING A SHIELDED HOUSING MOUNTED ON AN OUTER CIRCUIT BOARD AND HAVING AN INNER CIRCUIT BOARD WITH A TUNER CHIP

BACKGROUND

The invention relates to systems and methods for decoding television (TV) signals, and in particular to television tuner can (tuner module) assemblies.

A television tuner receives a radio-frequency signal such as an over-the-air or cable TV signal, and converts the frequency of a channel of interest to a fixed, intermediate frequency suited for further signal processing. Television tuners may be provided as part of a tuner module (tuner can), which incorporates a tuner chip (integrated circuit), a cable connector, and other components. A tuner module may be mounted on a printed circuit board (PCB) of a television receiver system such as a TV set, set-top box, or computer. The design of tuner modules is limited by a number of constraints, including shielding, space, cost, and other requirements.

SUMMARY

According to one aspect, a television tuner module configured to be mounted on an external printed circuit board (PCB) comprises: a coaxial radio frequency (RF) connector including a conductive tubular outer shell and a central signal pin centered within the tubular outer shell; a metallic television tuner module housing connected to the RF connector and configured to be mounted on the external PCB, the tuner module housing having a shielded internal volume, wherein a major dimension of the shielded internal volume in a plane perpendicular to the central signal pin is less than 120% of a diameter of the outer shell of the RF connector; an internal printed circuit board (PCB) mounted within the tuner module housing, the internal PCB being perpendicular to the central signal pin, the internal PCB having a central PCB contact situated in a center of a first, connector-facing side of the internal PCB, wherein the central signal pin contact is directly connected to the central PCB contact; a television tuner chip centrally mounted on a second side of the internal PCB facing away from the RF connector; and a set of PCB interconnection pins generally perpendicular to the internal PCB, the set of PCB interconnection pins being electrically connected to the internal PCB, for electrically connecting the internal PCB to the external PCB.

According to another aspect, a television tuner module configured to be mounted on an external printed circuit board (PCB) comprises: a coaxial radio frequency (RF) connector including a conductive tubular outer shell and a central signal pin centered within the tubular outer shell; a metallic television tuner module housing connected to the RF connector and configured to be mounted on the external PCB, the tuner module housing having a shielded internal volume, wherein a major dimension of the shielded internal volume in a plane perpendicular to the central signal pin is less than 120% of a diameter of the outer shell of the RF connector; an internal printed circuit board (PCB) mounted within the tuner module housing, the internal PCB being parallel to the central signal pin, the internal PCB having a PCB contact situated on a first side of the internal PCB, wherein the central signal pin contact is directly connected to the central PCB contact; a television tuner chip centrally mounted on a second side of the internal PCB opposite the first side of the internal PCB; and a set of PCB interconnection pins generally perpendicular to the internal PCB, the set of PCB interconnection pins being electrically connected to the internal PCB, for electrically connecting the internal PCB to the external PCB.

BRIEF DESCRIPTION OF THE DRAWINGS

The foregoing aspects and advantages of the present invention will become better understood upon reading the following detailed description and upon reference to the drawings where:

FIGS. 1-A-C show exemplary television receiver systems (a TV set, set-up box, and computer, respectively) including a compact television tuner can according to some embodiments of the present invention.

FIGS. 2-A-B show side and top views of a vertical-mount compact television tuner module (tuner can) according to some embodiments of the present invention.

FIGS. 3-A-B show side and front views of a side-mount compact television tuner module according to some embodiments of the present invention.

DETAILED DESCRIPTION OF PREFERRED EMBODIMENTS

In the following description, it is understood that all recited connections between structures can be direct operative connections or indirect operative connections through intermediary structures. A set of elements includes one or more elements. Any recitation of an element is understood to refer to at least one element. A plurality of elements includes at least two elements. Unless otherwise required, any described method steps need not be necessarily performed in a particular illustrated order. Unless otherwise specified, the term rectangle encompasses both rectangles with equal sides (i.e. squares), and rectangles with unequal sides. Unless otherwise specified, the term longitudinal is used to refer to a direction defined by a central axis of an RF connector, while the term transverse is used to refer to a plane that is transverse (e.g. perpendicular) to the longitudinal direction.

The following description illustrates embodiments of the invention by way of example and not necessarily by way of limitation.

FIGS. 1-A-C show exemplary television receiver systems (a TV set, set-up box, and computer, respectively) including a compact television tuner can according to some embodiments of the present invention. In some embodiments, a compact TV tuner module 20 may be provided as part of a television set 10a suitable for decoding and displaying TV signals (FIG. 1-A), a set-top/decoder box 10b suitable for decoding TV signals and sending an output signal to a TV set, and/or a desktop, laptop, or tablet computer 10c configured to decode and display TV signals. Tuner module 20 includes a standard RF connector connected to a coaxial cable, which provides a connection to an external TV signal source such an antenna or cable TV source.

FIG. 2-A-B show side and top views of a vertical-mount compact television tuner module 20 according to some embodiments of the present invention. Tuner module 20 is mounted on an external printed circuit board 22 in a top-facing orientation. Tuner module 20 includes a coaxial RF connector 26, and a module body (tuner can) 24 connected to RF connector 26. RF connector 26 may be a standard female F-connector commonly used for television signals in the United States, or a standard IEC 169-2 (Belling-Lee) connector commonly used in Europe. In the illustrated embodiment, RF connector 26 includes a tubular outer contact 30 having an external thread 32 for connecting to a matching external connector, and a solid central signal pin 34 forming an inner contact of RF connector 26. An IEC 169-2 connector may have a smooth rather than threaded exterior, and may have a hollow central signal pin.

Module body 24 includes a metal housing 40 having one or more (e.g. four) side walls 44 connected to PCB 22, and a top wall 46 connected to side walls 44. Housing 40 encloses a shielded internal volume 42 of module body 24. A central opening 48 in top wall 46 accommodates the passage of central pin 34 into the interior of housing 40. A crystal oscillator 50 is mounted on PCB 22 in an area covered by housing 40. Crystal oscillator 50 generates a signal having a precise frequency, which is used by the circuit of tuner module 20 to process received RF signals. Module body 24 further includes a printed circuit board (PCB) 52 and a number of components supported by PCB 52, described below. PCB 52 is held in place by bent-in metal flaps 54 defined in side walls 44. PCB 52 is mounted upside-down within housing 40, parallel to PCB 22 and with its conductive traces facing those of PCB 22. A base 58 of central pin 34 is secured directly to the center of the top (back) side of PCB 52. A plurality of rigid, conductive PCB-interconnection pins 90 form electrical connections between PCB 52 and PCB 22. PCB interconnection pins 90 extend within shielded internal volume 42 and are generally perpendicular to the major plane of PCB 52.

A bare-silicon tuner chip (integrated circuit) 60 is mounted on an insulating planar support (mount) 62, which in turn is mounted on the center of the bottom, conductively-patterned side of PCB 52. Insulating support 62 may be formed by a patch of adhesive mounting tape, which is adhered on one side to PCB 52 and on the other side to the semiconductor surface of tuner chip 60. In some embodiments, tuner chip 60 does not include chip packaging or other enclosure surrounding its semiconductor (e.g. silicon) structure. In some embodiments, a glob (lump) of insulating material 61 may be added on top of the bare die of tuner chip 60, to protect the chip and a number of bond wires (conductive leads) described below. A plurality of flexible conductive leads 64 connect tuner chip 60 to conductors on PCB 52. A plurality of circuit components 66 such as capacitors, resistors and/or inductors are mounted on the bottom side of PCB 52, and are electrically connected to tuner chip 60 and crystal oscillator 50. Circuit components 66 may include, among others, a filter connected between connector 26 and an input of tuner chip 60, as well as a number of blocking capacitors connected between ground and corresponding ports of tuner chip 60. TV RF signals received through RF connector 26 are processed by the mixed analog-digital circuit of tuner module 20 to generate a digital TV output which is transmitted to external PCB 22.

In some embodiments, tuner chip 60 may be flip-chip mounted, i.e. mounted with its active (top) side directly on PCB 52, with electrical contact made directly between conductors on tuner chip 60 and PCB 52. Flip-chip mounting allows eliminating the use of flexible wires such as flexible conductive leads 64 to connect tuner chip 60 to PCB 52, or an insulating support such as insulating support 62. A flip-chip mounted tuner chip may be covered by a protective insulating material in some embodiments.

As shown in FIG. 2-B, tuner chip 60 is centered on PCB 52, within the shielded internal volume enclosed by metal housing 40. In particular, FIG. 2-B illustrates several distances/lengths: D denotes the diameter of RF connector 26, L denotes the major dimension of the shielded internal volume in a transverse plane (the plane perpendicular to central pin 34), d denotes the difference between D and L, and a length l denotes a size of tuner chip 60 in the transverse plane. In the illustrated embodiment, metal housing 40 has a square shape in the transverse plane, and thus its major dimension in the transverse plane is equal to the dimension along the other, orthogonal axis in the transverse plane (i.e. the vertical direction in FIG. 2-B). If the transverse cross-section of the shielded internal volume enclosed by metal housing 40 is shaped as a rectangle with unequal sides, the major dimension is the longest side of the rectangle.

In some embodiments, the major dimension L is no more than 150% of the RF connector diameter D, more particularly no more than 120% of the diameter D, and in exemplary embodiments no greater than the diameter D. In an exemplary embodiment, the RF connector diameter D is about 11.5 mm, while the major dimension L has a value between ⅜ and ⅝", or between 9.5 and 16.9 mm. In some embodiments, the height (the extent along the vertical direction in FIG. 2-A) of the shielded internal volume enclosed by metal housing 40 may have a value between ⅜ and ⅝", or between 9.5 and 16.9 mm, while the shielded internal volume may have a transverse size of about 8×8 mm. The total height of metal housing 40 may be the height of its shielded enclosed volume 42 plus the height of any housing legs used to connect metal housing 40 to external PCB 22.

In some embodiments, the length l of bare tuner chip 60 is about 2-3 mm, for a total area of 2×2 mm to 3×3 mm. In comparison, commercially available packaged tuner chips commonly have sizes of about 4×4 mm to 6×6 mm, in part due to the space taken by chip packaging. Such chip packaging may include an encapsulant such as an epoxy, silicone or polyimide material enclosing the semiconductor chip structure. Such chip packaging protects the semiconductor device but also takes up significant amounts of space. In a compact tuner module in which the shielded internal space of the module has a size of about 8×8 mm, such a packaged tuner chip may not leave sufficient space for placing analog circuit components 66 on PCB 52.

In some embodiments, parts of the external surface of RF connector 26 may be trimmed to form two parallel, smooth (non-threaded) surfaces shown at 68 in FIG. 2-B. In such embodiments, if the diameter D of RF connector is 11.5 mm, the distance between the two parallel surfaces 68 may be chosen to be about 9.5 mm.

FIGS. 3-A-B show side and front views of a side-mount compact television tuner module 120 according to some embodiments of the present invention. Tuner module 120 is mounted on an external printed circuit board 22 in a side-facing orientation. Tuner module 120 includes a coaxial RF connector 26 as described above, and a module body (tuner can) 124 connected to RF connector 26. As described above, RF connector 26 may include a tubular outer contact 30 having an external thread 32 for connecting to a matching external connector, and a solid central signal pin 34 forming an inner contact of RF connector 26.

Module body 124 includes a metal housing 140 having one or more (e.g. four) side walls 144, including a front wall 144', connected to PCB 22, and a top wall 146 connected to side walls 144. Housing 140 encloses a shielded internal volume 142 of module body 124. A plurality of legs 82 (e.g. four legs) of housing 140 are used to mount housing 140 onto PCB 22. In the illustrated embodiments, shielded internal volume 142 is enclosed by walls 144, 146, and is not enclosed by legs 82. A central opening 148 in a front 144' accommodates the passage of central pin 34 into the interior of housing 140. A crystal oscillator 50 is mounted on PCB 22 in an area covered by housing 140. As described above, crystal oscillator 50 generates a signal having a precise frequency, which is used by the circuit of tuner module 20 to process received RF signals. Module body 124 further includes a printed circuit board (PCB) 152 and a number of components supported by PCB 152. PCB 152 is held in place by bent-in metal flaps 154 defined in side walls 144. PCB 152 is mounted upside-down within housing 140, parallel to PCB 22 and with its conductive traces facing those of PCB 22. A base 158 of central pin 34 is secured directly to the center of the top (back) side of PCB 152. A plurality of rigid, conductive PCB-interconnection pins 190 form electrical connections between PCB 152 and PCB 22. PCB interconnection pins 190 extend within shield internal volume 142 and are generally perpendicular to the major plane of PCB 152.

A bare-silicon tuner chip (integrated circuit) 60 is mounted on an insulating planar support (mount) 62, which in turn is mounted on the center of the bottom, conductively-patterned side of PCB 152. Insulating support 62 may be formed by a patch of adhesive mounting tape, which is adhered on one side to PCB 52 and on the other side to the semiconductor surface of tuner chip 60. As described above, in some embodiments tuner chip 60 does not include chip packaging or other enclosure surrounding its semiconductor (e.g. silicon) structure. A plurality of flexible conductive leads 64 connect tuner chip 60 to conductors on PCB 152. A plurality of circuit components 66 such as capacitors, resistors and/or inductors are mounted on the bottom side of PCB 52, and are electrically connected to tuner chip 60 and crystal oscillator 50. TV RF signals received through RF connector 26 are processed by the mixed analog-digital circuit of tuner module 20 to generate a digital TV output which is transmitted to external PCB 22.

As described above, in some embodiments tuner chip 60 may be flip-chip mounted directly on PCB 152, and/or covered with an insulating material for protection in either the illustrated configuration or in a flip-chip mounted configuration.

As shown in FIG. 3-B, tuner chip 60 is centered on PCB 152, within the shielded internal volume enclosed by metal housing 140. In particular, FIG. 3-B illustrates several distances/lengths: D denotes the diameter of RF connector 26, L denotes the major dimension of the shielded internal volume in a transverse plane (the plane perpendicular to central pin 34, and a length l denotes a size of tuner chip 60 in the transverse plane. In the illustrated embodiment, metal housing 140 has a square shape in the transverse plane, and thus its major dimension in the transverse plane is equal to the dimension along the other, orthogonal axis in the transverse plane (i.e. the vertical direction in FIG. 2-B). If the transverse cross-section of the shielded internal volume enclosed by metal housing 40 is shaped as a rectangle with unequal sides, the major dimension is the longest side of the rectangle.

In some embodiments, the major dimension L is no more than 150% of the RF connector diameter D, more particularly no more than 120% of the diameter D, and in exemplary embodiments no greater than the diameter D. In an exemplary embodiment, the RF connector diameter D is about 11.5 mm, while the major dimension L has a value between ⅜ and ⅝", or between 9.5 and 16.9 mm. In some embodiments, the height (the extent along the vertical direction in FIG. 2-A) of the shielded internal volume enclosed by metal housing 40 may have a value between ⅜ and ⅝", or between 9.5 and 16.9 mm. The total height of metal housing 140 may be the height of its shielded enclosed volume plus the height of any housing legs used to connect metal housing 40 to external PCB 22.

Designing a compact and reliable tuner module that is comparable in transverse size to a standard coaxial TV connector is subject to multiple, often conflicting constraints. Such a tuner ideally provides RF shielding to its internal circuit components. Also, such a tuner module can be subject to significant forces/stresses as an external RF connector is screwed or slid onto the tuner module RF connector. Such forces, if transmitted to some tuner module components such as the tuner chip, may cause undesired strain on the internal components. At the same time, the sizes of commercial tuner chips and associated circuit component such as crystal oscillators, capacitors and inductors constrain the practical dimensions needed to house the tuner module internal components. For example, common crystal oscillators may have a size of one to several mm by several mm; more compact crystal oscillators may have costs that constitute a large fraction of the typical total cost for the entire tuner module. A compact, reliable, and cost-effective tuner module may be particularly useful for use in television sets or other display devices, and in particular portable display devices, for which a thin, compact design is a primary design consideration.

The exemplary designs illustrated above allow the production of relatively compact, cost-effective and reliable television tuner modules. Moving the crystal oscillator to outside the tuner module itself, onto the external (main) PCB, allows the use of a larger, less expensive crystal oscillator and frees up space in the tuner module housing for other tuner components, at the cost of an increased signal path between the crystal oscillator and tuner chip. Employing a bare silicon tuner chip, rather than an encapsulated one, allows further space savings. Connecting the central RF connector pin directly to the center of the back of the tuner module PCB, on the other side of the tuner chip, allows reducing the space needed for electrical connections to the RF connector, while limiting the stress transmitted to the tuner chip from external forces applied to the RF connector. Such designs may be employed in both top-facing and side-facing configurations, as described above.

It will be clear to one skilled in the art that the above embodiments may be altered in many ways without departing from the scope of the invention. Accordingly, the scope of the invention should be determined by the following claims and their legal equivalents.

What is claimed is:

1. A television tuner module configured to be mounted on an external printed circuit board (PCB), the tuner module comprising:
   a coaxial radio frequency (RF) connector including a conductive tubular outer shell and a central signal pin centered within the tubular outer shell;
   a metallic television tuner module housing connected to the RF connector and configured to be mounted on the external PCB, the tuner module housing having a shielded internal volume, wherein a major dimension of the shielded internal volume in a plane perpendicular to the central signal pin is less than 120% of a diameter of the outer shell of the RF connector;
   an internal printed circuit board (PCB) mounted within the tuner module housing, the internal PCB being perpendicular to the central signal pin, the internal PCB having a central PCB contact situated in a center of a first, connector-facing side of the internal PCB, wherein the central signal pin contact is directly connected to the central PCB contact;
   a television tuner chip centrally mounted on a second side of the internal PCB facing away from the RF connector; and
   a set of PCB interconnection pins generally perpendicular to the internal PCB, the set of PCB interconnection pins being electrically connected to the internal PCB, for electrically connecting the internal PCB to the external PCB.

2. The television tuner module of claim 1, wherein the television tuner chip is a bare chip, and wherein the television tuner module further comprises an insulating planar support adhered on one side to the second side of the internal PCB and on an opposite side to a semiconductor surface of the television tuner chip.

3. The television tuner module of claim 1, wherein the tuner module housing comprises a plurality of bent-in metal flaps supporting the internal PCB.

4. The television tuner module of claim 1, wherein the tuner chip is electrically connected to a crystal oscillator mounted on the external PCB within the shielded internal volume, for receiving a crystal oscillator output signal.

5. The television tuner module of claim 1, wherein the diameter of the outer shell has a value between 11 mm and 12 mm, and the major dimension of the shielded internal volume has a value of less than 17 mm.

6. The television tuner module of claim 5, wherein the major dimension of the shielded internal volume has a value of less than 12 mm.

7. The television tuner module of claim 1, wherein the major dimension of the shielded internal volume in the plane perpendicular to the central signal pin is not larger than the diameter of the outer shell of the RF connector.

8. The television tuner module of claim 1, wherein the major dimension of the shielded internal volume in the plane perpendicular to the central signal pin is no larger than the diameter of the outer shell of the RF connector.

9. The television tuner module of claim 1, wherein the television tuner chip is mounted on the internal PCB with an active side of the television tuner chip facing and in direct electrical contact with a conductor of the internal PCB.

10. The television tuner module of claim 1, further comprising a plurality of flexible conductive leads extending from the internal PCB to a major face of the television tuner chip facing away from the RF connector, for electrically connecting the television tuner chip to the internal PCB.

11. A television tuner module configured to be mounted on an external printed circuit board (PCB), the tuner module comprising:
a coaxial radio frequency (RF) connector including a conductive tubular outer shell and a central signal pin centered within the tubular outer shell;
a metallic television tuner module housing connected to the RF connector and configured to be mounted on the external PCB, the tuner module housing having a shielded internal volume, wherein a major dimension of the shielded internal volume in a plane perpendicular to the central signal pin is less than 120% of a diameter of the outer shell of the RF connector;
an internal printed circuit board (PCB) mounted within the tuner module housing, the internal PCB being parallel to the central signal pin, the internal PCB having a PCB contact situated on a first side of the internal PCB, wherein the central signal pin contact is directly connected to the central PCB contact;
a television tuner chip centrally mounted on a second side of the internal PCB opposite the first side of the internal PCB; and
a set of PCB interconnection pins generally perpendicular to the internal PCB, the set of PCB interconnection pins being electrically connected to the internal PCB, for electrically connecting the internal PCB to the external PCB.

12. The television tuner module of claim 11, wherein the television tuner chip is a bare chip, and wherein the television tuner module further comprises an insulating planar support adhered on one side to the second side of the internal PCB and on an opposite side to a semiconductor surface of the television tuner chip.

13. The television tuner module of claim 11, wherein the tuner module housing comprises a plurality of bent-in metal flaps supporting the internal PCB.

14. The television tuner module of claim 11, wherein the tuner chip is electrically connected to a crystal oscillator mounted on the external PCB within the shielded internal volume, for receiving a crystal oscillator output signal.

15. The television tuner module of claim 11, wherein the diameter of the outer shell has a value between 11 mm and 12 mm, and the major dimension of the shielded internal volume has a value of less than 17 mm.

16. The television tuner module of claim 15, wherein the major dimension of the shielded internal volume has a value of less than 12 mm.

17. The television tuner module of claim 11, wherein the major dimension of the shielded internal volume in the plane perpendicular to the central signal pin is not larger than the diameter of the outer shell of the RF connector.

18. The television tuner module of claim 11, wherein the major dimension of the shielded internal volume in the plane perpendicular to the central signal pin is no larger than the diameter of the outer shell of the RF connector.

19. The television tuner module of claim 11, wherein the television tuner chip is mounted on the internal PCB with an active side of the television tuner chip facing and in diect electrical contact with a conductor of the internal PCB.

20. The television tuner module of claim 11, further comprising a plurality of flexible conductive leads extending from the internal PCB to a major face of the television tuner chip facing away from internal PCB, for electrically connecting the television tuner chip to the internal PCB.

* * * * *